United States Patent
Chou et al.

(10) Patent No.: US 6,800,493 B2
(45) Date of Patent: Oct. 5, 2004

(54) PRE-ERASE MANUFACTURING METHOD

(75) Inventors: Ming-Hung Chou, Miaoli (TW); Smile Huang, Tainan (TW); Jui-Lin Lu, Hsinchu (TW); Tung-Hwang Lin, Pingtung (TW)

(73) Assignee: Macronix International Co., Ltd., Hsinchu (TW)

( * ) Notice: Subject to any disclaimer, the term of this patent is extended or adjusted under 35 U.S.C. 154(b) by 290 days.

(21) Appl. No.: 10/026,125

(22) Filed: Dec. 20, 2001

(65) Prior Publication Data

US 2003/0119213 A1 Jun. 26, 2003

(51) Int. Cl.$^7$ .............................................. H01L 21/00
(52) U.S. Cl. ........................................................ 438/4
(58) Field of Search .............................. 438/4; 365/201

(56) References Cited

U.S. PATENT DOCUMENTS

| | | | |
|---|---|---|---|
| 5,393,701 A | 2/1995 | Ko et al. | |
| 5,581,510 A | * 12/1996 | Furusho et al. | ............. 365/201 |
| 5,912,844 A | 6/1999 | Chen et al. | |
| 5,918,125 A | 6/1999 | Guo et al. | |
| 6,218,227 B1 | 4/2001 | Park et al. | |
| 6,277,691 B1 | 8/2001 | Quoc et al. | |
| 6,297,096 B1 | 10/2001 | Boaz | |
| 6,477,084 B1 | 11/2002 | Eitan | |
| 2001/0026970 A1 | 10/2001 | Eitan et al. | |

FOREIGN PATENT DOCUMENTS

EP    1096505    5/2001

OTHER PUBLICATIONS

Mori et al., "Reliability Study of Thin Inter–poly Dielectrics for Non–volatile Memory Application", 1990 IEEE, Reliability Physics Symposium, 28$^{th}$ Annual Proceedings., International, pp. 132–144.*

* cited by examiner

*Primary Examiner*—Evan Pert
(74) *Attorney, Agent, or Firm*—Ernst J. Beffel, Jr.; Haynes Beffel & Wolfeld LLP

(57) ABSTRACT

The present invention includes methods to pre-erase non-volatile memory cells using an electrical erase signal prior to dividing a wafer into dies. Particular aspects of the present invention are described in the claims, specification and drawings.

22 Claims, 1 Drawing Sheet

PRE-ERASE MANUFACTURING METHOD

BACKGROUND OF THE INVENTION

Production of structures on a die section of a wafer typically involves plasma or reactive ion etching. These and other anisotropic etching methods are among production steps that can result in a charge accumulation. Charge accumulation can cause unstable device characteristics and low yield, particularly for non-volatile memories. Conventionally, exposure to UV radiation before division of the wafer into dies has been used to relieve the charge accumulation. Exposure to UV radiation is not a universal remedy, as some memory structures and materials accumulate charges, instead of relieving them, when exposed to UV.

Accordingly, an opportunity arises to devise methods that relieve charge accumulation from structures on the die sections of a wafer, during manufacturing, without UV exposure.

SUMMARY OF THE INVENTION

The present invention includes methods to pre-erase non-volatile memory cells using an electrical erase signal prior to dividing a wafer into dies. Particular aspects of the present invention are described in the claims, specification and drawings.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
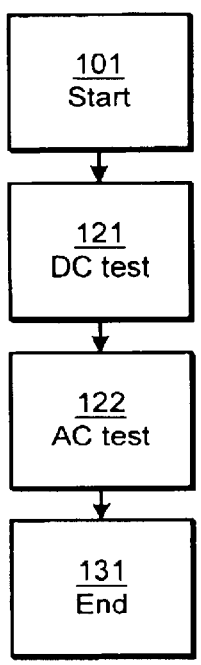
FIG. 1 is a flow chart of a traditional testing and wafer sorting process.

FIG. 1 is a flowchart of wafer processing during the so-called sort. Between the start 101 and end 131 of the sort, various tests are performed, which may include DC tests 121 and AC tests 122. Conventional tests may include testing for open or short conditions and column or word line stress tests. The outcome of these tests determines how the wafer will be further processed. For instance, the wafer may be scrapped, it may go through additional process steps or it may be subdivided into dies and packaged as chips (so-called back end processing.)

One of the outcomes of sorting is to detect unstable or defective circuits in dies. In some fabs, if more than half of the dies tested (e.g., 3 of 5 dies) are defective, the wafer is scrapped. For non-volatile memories, a cause of unstable, non-uniform or defective circuits is charge accumulation in memory cells. Non-volatile memories depend on charges preserved in a layer or gate. In a floating gate arrays, for instance, an accumulation of charges during production can make a cell unusable. ONO structures, for instance, are vulnerable to trapping of charges in the nitride layer during manufacturing. The vulnerability of the nitride layer is apparent in production of NROM and in application of SONOS and MONOS manufacturing processes.

Build up of electrical charges during anisotropic etching is a well-known phenomena. Charges from plasma, reactive ions or other substances used for etching are particularly attracted to some layers, such as metal layers. One of the phenomena is an antenna effect, in which certain patterns of metal in a layer accumulate a substantial charge that can damage memory cells in many ways, including burning through layers during a discharge or being trapped in a layer that is supposed to be programmable.

Charge build up during manufacturing is neutralized in some manufacturing processes by exposure of partially completed wafers to UV. Erasable UV-EPROMs have been in use for a long time, giving way recently to EEPROMs. Unfortunately, this is not a universal solution to charge build-up, because UV exposure increases charge accumulation for some processes and some structures, instead of relieving it. Pre-erasing using an electrical erase signal offers an alternative to UV exposure, during manufacturing.

Figure 2:
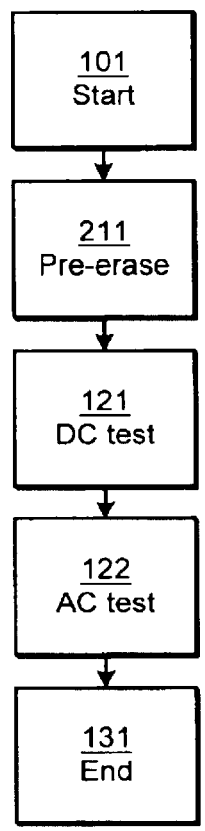
FIG. 2 is a flow chart of a pre-erase step, added to traditional testing and wafer sorting.

FIG. 2 depicts addition of a pre-erase step 211 prior to testing 121, 122 of the dies on a wafer. The exact placement of this pre-erase step is not critical to this invention, but illustrates of the usefulness of improving wafer and die yield prior to determining whether the dies are defective. Preferably, the pre-erase step takes place after the last step that produces substantial charge accumulation in a memory layer. This may be very late in the process, after a passivation layer has been applied and after pads have been exposed by etching. Or, for a memory cell that is buried, pre-erase may take place after covering whatever metal layers are directly above the memory cell. These metal layers may be covered by an insulating layer or a passivation layer. The pre-erase step can take place at any point in the process before the wafer is subdivided into dies.

Figure 4A:
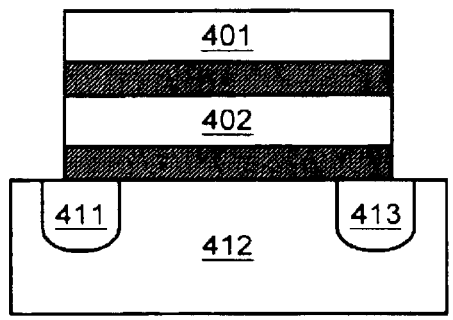
FIGS. 4A–4B are schematic diagrams of memory cells.
Figure 4B:
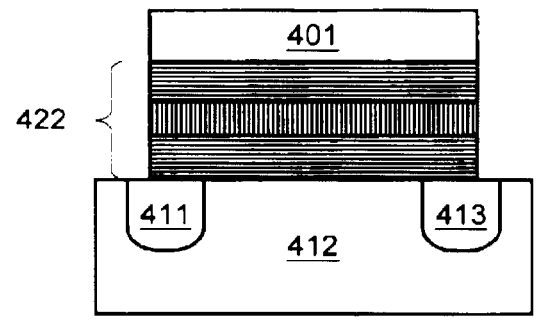

A pre-erase step can be carried out in virtually any way that an electrical erase ordinarily is performed on a non-volatile memory cell. The patent literature is very rich in examples of erasure strategies. One erasure process that may be used is a negative gate channel erase. This erase functions by Fowler-Nordheim tunneling. FIGS. 4A–4B identify regions that may be charged during an erasure in a floating gate and NROM or similar memory structure, respectively. A negative gate channel erase involves applying a voltage Vg to the control gate 401 and an opposite voltage Vs, Vb to the source 411 and the bulk or substrate 412 in the channel region. The drain 413 voltage Vd is allowed to float in this erase mode. In this erase and the others that follow, the functions of the drain and source can be reversed, with the opposite voltage applied to the drain and the source allowed to float. The source and drain can generically be referred to as two terminals for erasure purposes. One set of useful voltages for this erase is Vg=−12 v, Vs=Vb=8 v and Vd floats. Another erasure process that may be used is a negative gate source side erase. This erase functions by Fowler-Nordheim tunneling. A negative gate source (or drain) side erase involves applying a voltage Vg to the control gate 401 and an opposite voltage Vs to the source 411. The bulk or substrate 412 in the channel region is grounded to 0v. While the bulk in these illustrations appears to be a substrate, it may be a doped channel or an isolated doped channel, e.g., one surrounded by a further doped channel of an opposing doping type. The drain 413 voltage Vd is allowed to float in this erase mode. One set of useful voltages for this erase is Vg=−8 v, Vs=6 v, Vb=0 v and Vd floats. In this erase, the functions of the drain and source can be reversed, with the opposite voltage applied to the drain and the source allowed to float. A further erasure process that may be used is a hot hole erase. This erase functions by injecting holes into the cell. Two variations on the hot hole erase apply voltages to one or both of the source and drain. In one variation, a hot hole erase involves applying a voltage Vg to the control gate 401 and an opposite voltage Vs to the source 411. The bulk or substrate 412 in the channel region is grounded to 0 v. The drain 413 voltage Vd is allowed to float in this erase mode. One set of useful voltages for this erase is Vg=−3 v, Vs=8 v, Vb=0 v and Vd floats. In this erase, the functions of the drain and source can be reversed, with the opposite voltage applied to the drain and the source allowed to float. Another variation involves biasing both the source and drain, instead of allowing one to float. Injection of hot holes into a floating gate 402 or an ONO layer 422 relieves build up of electrons, which may be difficult to extract.

Figure 3:
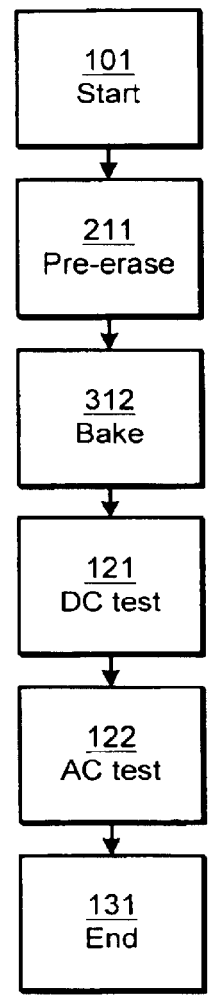
FIG. 3 is a flow chart of a pre-erase step and a bake step added to traditional testing and wafer sorting.

FIG. 3 adds an additional bake 312, following the pre-erase 211. This bake should be under conditions sufficient to diffuse charges added to the floating gate 402 or the ONO layer 412 by the erase. Two different temperature ranges appear to be useful: 80–150 degrees Celsius and 150–250 degrees Celsius. The time required for sufficient effect can readily be determined, without an excessive degree of experimentation.

Not illustrated but useful with the present invention is a verify step to determine the erasure state of memory cells. Many verification and correction schemes have been described for non-volatile memory and particularly for EEPROM or NROM memories. Virtually any of them can be used with the present invention, if enough time is allowed during processing. The general scheme is that if a memory cell with an improper erasure state is found, a further signal is sent to alter the memory cell. In some instances, the desired charge is deliberately under achieved, so that it will not be exceeded with corrective signals. In other instances, over achieving is allowed, either with or without correction. In connection with the present invention applied to an NROM cell, a surplus of holes may be better than a surplus of electrons, as the subsequent programming process accumulates electrons.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim as follows:

1. A method of relieving charge accumulations from non-volatile memory structures on dies on a wafer, including:
    applying an electrical erase signal to the non-volatile memory structures on the dies; and
    baking the wafer under conditions sufficient to diffuse charges resulting from the erase signal.

2. The method of claim 1, wherein the electrical erase signal produces a negative gate channel erase by Fowler-Nordheim tunneling.

3. The method of claim 1, wherein the electrical erase signal produces a negative gate source side erase by Fowler-Nordheim tunneling.

4. The method of claim 1, wherein the electrical erase signal produces a hot hole erase.

5. The method of claim 4, wherein the hot hole erase includes biasing either a source or drain of the memory cells.

6. The method of claim 4, wherein the hot hole erase includes biasing both of a source and drain of the non-volatile memory cells.

7. The method of claim 1, wherein the non-volatile memory structures include an ONO structure.

8. The method of claim 7, wherein the electrical erase signal produces a hot hole erase.

9. The method of claim 8, wherein the hot hole erase includes biasing either a source or a drain of the memory cells.

10. The method of claim 8, wherein the hot hole erase includes biasing both a source and a drain of the non-volatile memory cells.

11. The method of claim 1, wherein the baking includes heating the wafer to between 80 and 150 degrees Celsius.

12. The method of claim 1, wherein the baking includes heating the wafer to between 150 and 250 degrees Celsius.

13. The method of claim 1, further including determining an erasure state of the memory cells and repeatedly applying an additional electrical erase signal until a predetermined erasure state is achieved.

14. A method of relieving charge accumulations from ONO non-volatile memory structures on dies on a wafer, including applying an electrical erase signal to the ONO non-volatile memory structures on the dies prior to subdividing the wafer into the dies, further including baking the wafer after applying the electrical erase signal under conditions sufficient to diffuse charges resulting from the electrical erase signal.

15. The method of claim 14, wherein the baking includes heating the wafer to between 80 and 150 degrees Celsius.

16. The method of claim 14, wherein the baking includes heating the wafer to between 150 and 250 degrees Celsius.

17. The method of claim 14, wherein the electrical erase signal produces a negative gate channel erase by Fowler-Nordheim tunneling.

18. The method of claim 14, wherein the electrical erase signal produces a negative gate source side erase by Fowler-Nordheim tunneling.

19. The method of claim 14, wherein the electrical erase signal produces a hot hole erase.

20. The method of claim 19, wherein the hot hole erase includes biasing either a source or a drain of the memory cells.

21. The method of claim 19, wherein the hot hole erase includes biasing both a source and a drain of the non-volatile memory cells.

22. The method of claim 21, further including determining an erasure state of the memory cells and repeatedly applying an additional electrical erase signal until a predetermined erasure state is achieved.

* * * * *